(12) United States Patent
Schieleit (10) Patent No.: US 9,632,116 B2
(45) Date of Patent: Apr. 25, 2017

(54) DC REVERSE POLARITY DETECTION

(71) Applicant: SMA Solar Technology AG, Niestetal (DE)

(72) Inventor: Andre Schieleit, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 193 days.

(21) Appl. No.: 14/599,597

(22) Filed: Jan. 19, 2015

(65) Prior Publication Data

US 2015/0130442 A1 May 14, 2015

Related U.S. Application Data

(63) Continuation of application No. PCT/EP2013/064937, filed on Jul. 15, 2013.

(30) Foreign Application Priority Data

Jul. 20, 2012 (DE) .................. 10 2012 106 612

(51) Int. Cl.
*G01R 19/14* (2006.01)
*H02S 50/10* (2014.01)

(52) U.S. Cl.
CPC .............. *G01R 19/14* (2013.01); *H02S 50/10* (2014.12)

(58) Field of Classification Search
CPC combination set(s) only.
See application file for complete search history.

(56) References Cited

U.S. PATENT DOCUMENTS

| 3,600,678 A | 8/1971 | Garrett |
| 3,699,442 A * | 10/1972 | Riley ............... G01R 19/20 324/117 R |
| 4,025,850 A | 5/1977 | Spiteri |

(Continued)

FOREIGN PATENT DOCUMENTS

| CA | 2636675 A1 | 2/2009 |
| CN | 201918729 U | 8/2011 |

(Continued)

OTHER PUBLICATIONS

International Search Report dated Dec. 6, 2013 for International Application No. PCT/EP2013/064937.

*Primary Examiner* — Clayton E LaBalle
*Assistant Examiner* — Jas Sanghera
(74) *Attorney, Agent, or Firm* — Eschweiler & Potashnik, LLC (57) ABSTRACT

For inspecting polarities of poles of DC voltage sources, each pole being individually connected to one of separate input terminals of a combiner circuit, an inspection apparatus includes electric contacts each provided for one of the input terminals such that one of the poles of each DC voltage sources is each connected to one of the electric contacts, respectively. A signaling element when subjected to an electric signal emits a matching signal. One switching element per each of the at least two electric contacts forwards the electric signal if a polarity of a voltage present at the respective electric contact matches a polarity pre-set for the respective electric contact with regard to a reference potential, and blocks the electric signal if the polarity of the voltage does not match the pre-set polarity. The switching elements are electrically connected in series.

21 Claims, 4 Drawing Sheets (56) References Cited

U.S. PATENT DOCUMENTS

| | | | |
|---|---|---|---|
| 4,217,534 A * | 8/1980 | Cole ................... | H02J 7/0034 |
| | | | 320/105 |
| 4,233,560 A | 11/1980 | Blenman | |
| 5,270,638 A | 12/1993 | Mellott | |
| 6,542,349 B2 * | 4/2003 | Yagi ................... | G01N 23/223 |
| | | | 361/246 |
| 2008/0074097 A1 | 3/2008 | Chang | |

FOREIGN PATENT DOCUMENTS

| CN | 102193049 A | 9/2011 |
|---|---|---|
| DE | 202013100704 U1 | 3/2013 |
| EP | 2463914 A1 | 6/2012 |

\* cited by examiner

DC REVERSE POLARITY DETECTION

REFERENCE TO RELATED APPLICATIONS

This application is a continuation of International Application No. PCT/EP2013/064937, filed on Jul. 15, 2013, which claims priority to German Patent Application No. 10 2012 106 612.4, filed on Jul. 20, 2012.

FIELD

This disclosure relates to an inspection apparatus for inspecting polarities of poles of DC voltage sources individually connected to input terminals of a combiner circuit that are not connected to each other.

BACKGROUND

U.S. Pat. No. 5,270,638 discloses an inspection apparatus for inspecting polarities of poles of a DC voltage source. The inspection apparatus comprises two electric contacts which are connectable to the poles of the DC voltage source. The two electric contacts are connected to each other via a two-colored light emitting diode (LED) which outputs an optical signal depending on the polarity of the poles and the resulting current flow direction. For example, the LED glows red, if the polarity of the voltage present at one of the two electric contacts is positive with regard to the electric potential present at the other electrical contact. In case of an inversed polarity, the LED glows green. The inspection apparatus additionally comprises a further electric contact which, via a further two-colored LED, is connected to a voltage divider connected in parallel to the first two electric contacts. This further LED indicates the polarity of a voltage present at the further electric contact with regard to the average electric potential of the first two electric contacts.

CA 2,636,675 A1 discloses an inspection apparatus for inspecting polarities at an electric interface. The inspection apparatus comprises two electric contacts connected to each other via a signaling element. One of the two electric contacts is connectable to a voltage source, and the other electric contact is connectable to ground. The signaling element indicates the sign, e.g. the polarity of the voltage of the contact connected to the voltage source in that it outputs a signal depending on the current direction. The signaling element may, for example, comprise two anti-parallel LEDs.

U.S. Pat. Nos. 4,025,750, 3,600,678 and 4,233,560 each disclose an apparatus comprising a signaling element which in case of a polarity of an applied voltage matching a pre-set polarity is powered with an electric signal for outputting a matching signal. Further, each of these apparatuses comprises a switching element which blocks the matching signal from the signaling element in case the polarities do not match.

There still is a need of an inspection apparatus by which polarities of poles of a plurality of DC voltage sources individually connected to input terminals of a combiner circuit that are not yet connected to each other can be inspected easily.

SUMMARY

The present disclosure provides an inspection apparatus for inspecting polarities of poles of a plurality of DC voltage sources with regard to a reference potential, each pole being individually connected to one input terminal of a plurality of input terminals of a combiner circuit that are not connected to each other. The inspection apparatus comprises at least two electric contacts each configured to be individually connected to one input terminal of the plurality of input terminals such that at least two DC voltage sources of the plurality of DC voltage sources are each connected to one of the at least two electric contacts at one of their poles; and a signaling element configured to emit a matching signal when subjected to an electrical signal. The inspection apparatus further comprises one switching element per each of the at least two electric contacts, the switching element being configured to forward the electric signal towards the signaling element, if a polarity of a voltage present at the respective electric contact matches a polarity pre-set for the respective electric contact with regard to the reference potential, and to block the electric signal, if the polarity of the voltage does not match the pre-set polarity. The switching elements are electrically connected in series.

Other features and advantages of the present disclosure will become apparent to one skilled in the art upon examination of the following drawings and the detailed description. It is intended that all such additional features and advantages be included herein within the scope of the present disclosure, as defined by the claims.

BRIEF DESCRIPTION OF THE DRAWINGS

The present disclosure can be better understood with reference to the following drawings. The components in the drawings are not necessarily to scale, emphasis instead being placed upon clearly illustrating the principles of the present disclosure. In the drawings, like reference numerals designate corresponding parts throughout the several views.

DETAILED DESCRIPTION

If a plurality of DC voltage sources are combined via a combiner circuit, one input terminal is provided at the combiner circuit for each pole of each DC voltage source. The polarity of the pole to be connected is pre-set for each of these input terminals. Particularly, these polarities may be predetermined in that the combiner circuit—or a further circuitry connected thereto—is provided for connecting the voltage sources in parallel. i.e. for connecting together the input terminals for all poles of a same polarity of all of the DC voltage sources. Prior to actually connecting the poles, their polarities have to be checked in order to ensure that the poles of the DC voltage sources are connected to the correct input terminals.

Thus, the inspection device may, for example, be used for inspecting the polarities of poles of several strings of a photovoltaic system connected to the input terminals of an inverter or of a separate combiner box, prior to connecting the strings in parallel by connecting together the input terminals for the poles of the same polarities.

The disclosure is based on the finding that using the prior art inspection apparatuses for inspecting the polarities of poles of a plurality of DC voltage sources individually connected to input terminals of a combiner circuit which are not yet connected to each other takes a lot of time for successively inspecting the polarities of the poles of each individual DC voltage source. Further, a high level of care is required to avoid mismatching or neglecting any poles, for example by skipping them. In that, with an inspection apparatus according to the disclosure, the poles of the DC voltage sources no longer need to be inspected one after the other, like it has been the case in the prior art, but are simultaneously inspected, at least with regard to the polarities of one input terminal per DC voltage source, both the execution and the validity of the inspection are enhanced. In one embodiment, all polarities present at all input terminals of the combiner circuit are inspected simultaneously.

The inspection apparatus according to this disclosure comprises at least two electric contacts which are each assigned to one of the input terminals of the combiner circuit and which are connectable thereto. The at least two electric contacts are assigned to two input terminals which are each provided for one pole of one of at least two DC voltage sources. Thus, one electric contact of the inspection apparatus according to the disclosure is assigned to at least one of the two poles of each of the at least two DC voltage sources. In case of more than two DC voltage sources, the inspection apparatus has more than two electric contacts. In one embodiment, the inspection apparatus has a number of electric contacts corresponding to the number of DC voltage sources so that one electric contact of the inspection apparatus is provided for one of the poles of each of the DC voltage sources. In another embodiment, one electric contact of the inspection apparatus is assigned to each of the input terminals so that one electric contact is provided for each pole of each DC voltage source.

Generally, the combination circuit may be of any kind. For example, it may be provided for forwarding the poles of the DC voltage sources separately in that each input terminal is directly connected to a separate output terminal. In one embodiment of the combiner circuit, the input terminals are electrically connected. For example, those input terminals at which voltages of a same polarity are present may be connected to each other via an electric parallel connection to add up the currents flowing via the individual input terminals at common output terminals. During inspection of the polarities of the poles of the DC voltage sources connected to the input terminals of the combiner circuit, however, these input terminals may not (yet) be connected to each other.

If the polarities of voltages which are, via the assigned input terminals, present at the electric contacts each match the polarities pre-set for the electric contacts, i.e. if only voltages of correct polarities are present, a signaling element of the inspection apparatus is subjected to an electric signal for outputting a matching signal. Outputting the matching signal may be realized in an arbitrary way. For example, the matching signal may be an optical or acoustic signal.

If the polarity of the voltage which is present at any one of the electric contacts does not match the polarity pre-set for the respective electric contact, i.e. if a voltage of a wrong polarity is present, the signaling element, however, is not subjected to the electric signal for outputting the matching signal. In order to achieve this, each of the electric contacts is connected to a switching element which blocks the electric signal from the signaling element in case of a missing match. By electrically connecting these switching elements in series, it is ensured that the signaling element is not subjected to the electric signal for outputting the matching signal as soon as a voltage of a wrong polarity is only present at at least one of the electric contacts of the inspection apparatus.

Generally, the polarities for the electric contacts of the inspection apparatus may be pre-set arbitrarily. For example, different polarities may be pre-set for different electric contacts. In a particular simple embodiment of the inspection apparatus, however, the polarities pre-set for the electric contacts are all the same. In this embodiment, the switching elements provided for the electric contacts may all be the same and all be connected in a same way.

In one embodiment, the inspection apparatus according to the disclosure, in addition to the electric contacts, comprises further electric contacts. Whereas the electric contacts are assigned to input terminals which are each provided for one pole of each DC voltage source, the further electric contacts are assigned and connectable to input terminals which are each provided for another one of the poles of each DC voltage source. Thus, the inspection apparatus comprises contact pairs each comprising one of the electric contacts and one of the further electric contacts. Each of these pairs is assigned to one pair of input terminals which are provided for two different poles of one DC voltage source.

When, in the following, the general term "contact" or "contacts" is used, it refers to any one or both of the electric contacts and the further electric contacts.

Generally, any electric potential may be used as a reference potential, with regard to which the polarities of the voltages present at the electric contacts are inspected. For example, the reference potential may be electric ground or any externally defined absolute electric potential. Such an embodiment of the inspection apparatus according to the disclosure may be required, if the polarities of the voltages present at the input terminals are to be inspected with regard to a fixed or externally defined absolute potential. In another embodiment, the reference potential is defined by the average value of all potentials present at the electric contacts or the further electric contacts. In this case, the reference potential varies with all variations of the actually present voltages. In a similar way, the reference potential is adapted to the instantaneous potentials of the DC voltage sources, if the reference potential is defined by the average value of the electric potentials of negative and positive polarities present at all contacts. In another embodiment, the reference potential is defined by the highest or lowest electric potential present at all contacts.

In one embodiment, the inspection apparatus comprises at least one further signaling element which is assigned to the further electric contacts. Via the at least one further signaling element, the inspection apparatus outputs an error signal, if a voltage of a wrong polarity is present at anyone of the electric contacts. For outputting the error signal, the at least one further signaling element of the inspection apparatus is subjected to a further electric signal. By means of the further electric contacts and the at least one further signaling element, it is achieved that it may simultaneously be inspected whether the inspection apparatus functions properly and whether the input terminals are occupied by the poles of the DC voltage sources in the pre-set way. This is due to the fact that it is not possible that only a single one of the input terminals is occupied in a wrong way. If a voltage of a wrong polarity is present at one of the electric contacts, a voltage of a wrong polarity is also present at one of the further electric contacts, i.e. at that further electric contact which is connected to the input terminal for the other pole of the same DC voltage source. Thus, the inspection apparatus outputs the matching signal but no error signal, if all input terminals are occupied correctly. If, however, at least one of the DC voltage sources is connected to the input terminals of the combiner circuit with interchanged poles, the matching signal is blocked and at least one error signal is output. The presence of exactly one of the two signals indicates the function of the inspection apparatus, and the particular signal indicates correct or wrong polarities.

For the purpose of indicating at which of the further electric contacts the polarity is not correct, one individual further signaling element may be provided for each of the further electric contacts, which, upon a wrong polarity, is subjected to the further electric signal for outputting its error signal. The wrong polarity indicated by the error signal may then be positively assigned to the respective one of the further electric contacts and thus to the associated one of the input terminals of the combiner circuit. In this way, any pair of input terminals may be identified, which are provided for the two poles of one DC voltage source and which are connected to these poles with inversed polarities as compared to their pre-set polarities.

In case of a wrong polarity of the voltage which is present at any one of the further electric contacts, the at least one further signaling element, for outputting the error signal, may be directly subjected to the further electric signal via the respective further electric contact. In another embodiment, each further electric contact is connected to a further switching element which lets the further electric signal pass to the associated further signaling element in case of no match of polarities. For example, the further switching elements of the further electric contacts may be electrically connected in parallel to a single common further signaling element at their common output. This further signaling element is then subjected to the further electric signal for outputting the error signal as soon as no match is present at any one of the further electric contacts. In this case, it will not be directly seen from the error signal at which of the further electric contacts there is no match of polarities.

Generally, all switching elements of the inspection apparatus of the disclosure may be of an arbitrary kind. For example, relays or electronic switches may be used. In one embodiment, the switching elements are semiconductor switching elements. For example, the semiconductor switching elements may be realized as transistors like, for example, field effect transistors or bipolar transistors.

The semiconductor switching elements may be of a normally-on type. In one embodiment, however, the semiconductor switching elements are of a normally-off type so that the semiconductor switching elements only let the electric signal pass if a voltage of the correct polarity is present at the associated electric contact.

Each semiconductor switching element may have a reference terminal at a reference potential and a control terminal at which a voltage is present which has the same polarity as the voltage at the associated electric contact. Thus, the semiconductor switching element is controlled depending on the polarity of the voltage present at the associated electric contact with regard to the reference potential. The semiconductor switching element may be of such a kind that the semiconductor switching element lets the electric signal or the further electric signal pass, if the voltage at the associated electric contact has a positive polarity with regard to the reference potential, whereas it blocks the electric signals in case of a negative polarity. The semiconductor switching element, however, may also function in the inverse way.

In one embodiment, each semiconductor switching element is of such a kind that it blocks the electric signal or the further electric signal, if the reference potential is present at its control terminal, and that it only lets the electric signal or the further electric signal pass, if the voltage at its control terminal differs from the reference potential in a predetermined way, i.e. if it has the polarity which is the correct one for the respective electric contact. If the voltage at the control terminal, however, does not differ from the reference potential or differs from the reference potential with an opposite polarity, the semiconductor switching element blocks the electric signal or the further electric signal. In case of the further electric contacts, this is just the right polarity, at which it is intended to block the semiconductor switching elements. The further electric signal should only pass, if a voltage is present at the control terminal which is of the wrong polarity for the respective further electric contact.

In this embodiment of the inspection apparatus, one diode may be assigned to each semiconductor switching element which is electrically interconnected between the control terminal and the reference terminal. In this way, it is achieved that—depending on the conduction direction of all the diodes connected in parallel—the negative or the positive poles of all DC voltage sources are brought close to the reference potential and thus block the respective semiconductor switching element in a defined way. Vice versa, the voltages of the opposite poles of the DC voltage sources ensure that the switching elements let the respective electric signal pass.

In addition to the one diode between the reference terminal and the control terminal, a further diode oriented in the same conducting direction as seen from the control terminal may be assigned to each semiconductor switching element. This further diode is electrically interconnected between the control terminal and a common output of the semiconductor switching elements connected in series. These further diodes provide a voltage for generating the electric signals in the inspection device at the common output of the semiconductor switching elements connected in series.

Due to the two diodes assigned to each semiconductor switching element, both a particular stable switching behavior of the semiconductor switching elements and a particular stable outputting behavior of the error signal and/or the matching signal are achieved. Particularly, it is avoided that too high voltages are present at the semiconductor switching elements, if the semiconductor switching elements block the respective electric signal. On the other hand, the two diodes rectify the voltages present at the individual electric contacts and further electric contacts independent on their polarity such that a voltage supply for the inspection apparatus may be derived. Additionally, this rectification pre-sets a certain current flow direction and thus certain potentials at those sides of the diodes facing away from the electric contacts. These certain potentials correspond to the potentials of the correct polarity at the electric contacts (minus the conducting state voltage drop of the respective diodes), and may be directly used as reference potentials.

In one embodiment of the inspection apparatus of the disclosure, the switching states of all switching elements, in which the switching elements let the electric signal and/or the further electric signal pass or block the electric signal and/or the further electric signal, and in which the switching elements will be as long as no external voltage is present at the respective electric contacts, are adjustable. Here, "external voltage" particularly refers to the voltage which is present due to the pole of the associated DC voltage source connected to the respective input terminal of the combiner circuit. Thus, the switching state of switching elements at whose associated electric contacts no voltage is present, because they are purposefully not connected to any of the input terminals, for example, may be pre-set.

Alternatively, the switching states of the switching elements and/or the further switching elements of the inspection apparatus without external voltages being present at the associated contacts may be pre-set in a fixed way. For example, a voltage of the respective correct polarity may be applied to each of the contacts at which no external voltage is present, because no pole of the DC voltage sources is connected to the associates input terminal of the combiner circuit. This allows for inspecting polarities of voltages resulting from the poles of the DC voltage sources connected to the associated input terminals of the combiner circuit, even if such voltages are only present at a few of the plurality of contacts.

In a further embodiment, a voltage of the respective wrong polarity is applied to each of the contacts at which no external voltage is present although a pole of one of the DC voltage sources should be connected to the associated input terminal of the combiner circuit. In this way, it is ensured that the inspection apparatus outputs an error signal and/or no matching signal unless an external voltage having the correct polarity is present at each of these contacts. In this way, it is also guaranteed that the contacts of the inspection apparatus are in fact electrically connected to the input terminals of the combiner circuit to be inspected.

Changeover switches may be assigned to the switching elements to be able to purposefully pre-set the switching states of the switching elements without external voltage in a variable way. By means of these changeover switches, it can be switched between pre-setting a voltage of the respective correct or a voltage of the respective wrong polarity at the respective control terminal. In one embodiment, each changeover switch changes the polarities of the voltages present at the control terminals of two switching elements as long as no external voltages are present. These two switching elements are assigned to the two contacts or input terminals for the two poles of one DC voltage source. Thus, by means of one changeover switch, it can be pre-set whether external voltages have to be present at these two contacts or not to avoid the display of non-existing connection errors.

In one embodiment, the signaling element(s) of the inspection apparatus according to the disclosure output(s) an optical signal or optical signals. Each signaling element may, for example, be made as a light emitting diode (LED). LEDs may be directly subjected to and powered by the electric signal or the at least one further electric signal and have a long lifetime at a low power consumption. In order to have a matching signal optically differing from the error signal(s), the signaling element outputting the matching signal may, for example, be a green light emitting diode, whereas the at least one signaling element which outputs the error signal may, for example, be a red light emitting diode. Any other embodiments and color combinations are also possible. For example, an optical signal emitted by the signaling element may be modulated over time, to indicate an error signal, whereas the emitted optical signal may be essentially constant to indicate a full match of the polarities.

In order to provide a supply of electric energy for each signaling element, the inspection apparatus of the disclosure may comprise an energy storage providing the electric signal and all further electric signals. The energy storage may also be used to power any signaling element which needs additional electric energy besides the electric signal or further electric signal.

The energy storage may be an external energy storage, like for example a battery. The energy storage may, however, also be charged by the voltages present at the electric contacts. In one embodiment, the energy storage includes a capacitor charged by the voltages present at the electric contacts. A voltage delimiting diode electrically connected in parallel to the capacitor may prevent voltages that are too high to become present at the signaling element or the signaling elements. If the capacitor is connected to the common output of the semiconductor switching elements connected in series, which common output is connected to the electric contacts of the inspection apparatus via parallel diodes, these diodes serve as a rectifier for a defined charging of the capacitor.

Additionally, a current limiter for the signaling element and/or the further signaling elements may be provided in the inspection apparatus. Such a current limiter may, for example, be made of a transistor and of an ohmic resistor connected in series with the transistor. Due to the fact that the current limiter is arranged between the energy storage and the signaling element and/or the further signaling elements, the signaling elements are uniformly supplied with electric energy. Whereas even a simple ohmic resistor as a current limiter may avoid an undesired flicker of the LEDs, a uniform glow of the LEDs as long as the energy storage is sufficiently charged may be achieved by means of the series connection of the resistor and the transistor.

Further, a switch may be provided which has to be closed or operated to activate the inspection apparatus, i.e. so that the inspection apparatus outputs the matching signal or error signal. The switch may be interconnected between the energy storage and the signaling element and/or the further signaling element. Then, the energy storage may only be discharged via the signaling element and/or the further signaling elements, if the switch is closed, i.e. when an inspection is actually wanted, and any unnecessary discharging of the energy storage is avoided. The switch may be manually operated by a user of the inspection apparatus.

The inspection apparatus may be permanently connected to the combiner circuit or to its input terminals. In another embodiment, the inspection apparatus is made as a handheld apparatus comprising a housing and a connector block via which the input terminals of the combiner circuit are connectable to the electric contacts in a fixed on-to-one relationship. The inspection apparatus may thus be used with different combiner circuits to inspect whether the poles of connected DC voltage sources have the correct polarities.

Figure 1:
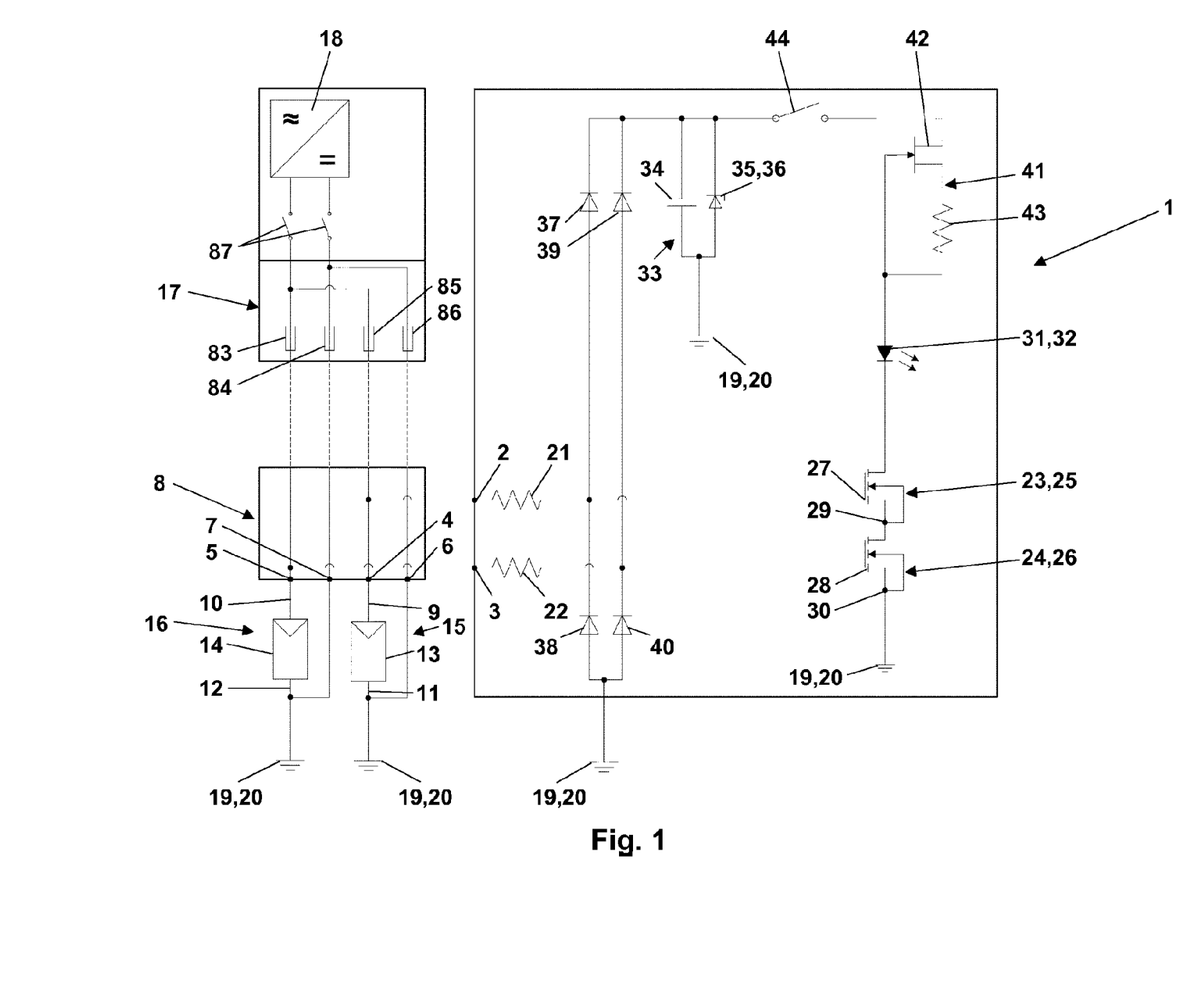
FIG. 1 is a schematic circuit diagram of a first embodiment of the inspection apparatus according to the disclosure.

Referring now in greater detail to the drawings, FIG. 1 shows an inspection apparatus 1 according to the present disclosure. The inspection apparatus 1 comprises two electric contacts 2, 3 which are each electrically connected to one input terminal 4, 5 of a total of four input terminals 4 to 7 of a combiner circuit 8. One pole 9 to 12 of two DC voltage sources 13, 14 is connected to each one of the input terminals 4 to 7 of the combiner circuit 8.

In the depicted embodiment, the DC voltage sources 13, 14 comprising the poles 9 to 12 are separate strings 15, 16 of a photovoltaic generator which are, for example, combined in the combiner circuit 8 to be further connected together via a common connector. In a combining circuitry 17, which is a separate circuitry here, the poles 9 and 10, and the poles 11 and 12 which have a same polarity are combined so that the DC currents generated by the individual strings 15, 16 are added up. The added up DC currents are supplied to an inverter 18 inverting them into an AC current. In FIG. 1, it is assumed that the positive poles 9 and 10 of the DC voltage sources 13, 14 which are to be connected to the input terminals 4, 5 have a defined positive polarity with regard to ground 19 which serves as a reference potential here, because the negative poles 11 and 12 or the center points of the DC voltage sources 13, 14 are grounded. By means of the inspection apparatus 1, it may be inspected whether each of the poles 9 to 12 has the pre-set polarity with regard to the reference potential 19 for which the respective input terminal 4 to 7 of the combiner circuit 8 is provided. For this purpose, the input terminals 4, 5 to which the positive poles 9 and 10 of the DC voltage sources 13 and 14 are to be connected are electrically connected to the electric contacts 2, 3 of the inspection apparatus 1. This is done before the combiner circuit 8 is connected to the combining circuitry 17, i.e. prior to any of the poles 9 to 12 being electrically connected to each other. In the depicted embodiment, the combining circuitry 17 comprises a fuse 83 to 86 for each input terminal 4 to 7. These fuses may serve for protection against an overcurrent which may occur when connecting the input terminals 4 and 5 or 6 and 7 in the combining circuitry 17. The input terminals 4 and 5, and 6 and 7 respectively combined by the combining circuitry 17 are connected to the inverter 18 by means of an all-pole switching main switch 87.

The two electric contacts 2, 3 of the inspection apparatus 1 are each electrically connected to a control terminal 27, 28 of a switching element 23, 24 via an input resistor 21, 22. The switching states of the switching elements 23, 24, which are semiconductor switching elements 25, 26 here, depend on the polarity of the voltages present at the contacts 2, 3 with regard to the reference potential 19. In the inspection device 1 depicted in FIG. 1, the switching elements 23, 24 are of such a type and connected in such a way that they block an electrical signal as long as the polarity of the voltages present at their control terminals 27, 28 is not positive with regard to the reference potential 19 present at their reference terminals 29, 30. The switching elements 23, 24 are electrically connected in series such that an electric signal is blocked as soon as the polarity of anyone of the two voltages which are present at the two electric contacts 2, 3 is not positive. Thus, in the depicted embodiment, the electric signal is blocked as long as no external voltage is present and as long as an external voltage is present at any of the electric contacts 2, 3, which has no positive polarity with respect to the reference potential 19.

By means of blocking the electric signal by the switching elements 23, 24 it is achieved that in case of a wrong polarity of the voltages present at the electric contacts 2, 3 a current flow through a signaling element 31 is interrupted so that the signaling element 31 does not emit a matching signal. If, however, voltages of positive polarity are present at the electric contacts 2, 3, the signaling element 31 is subjected to and powered by an electric signal for outputting the matching signal. In the embodiment depicted here, this means that, if voltages of positive polarity with regard to the reference potential 19 are present at both electric contacts 2, 3, the current circuit including the signaling element 31 is closed. The signaling element 31 is a light emitting diode (LED) 32 here, and the matching signal is an optical signal emitted by the LED 32, when the LED 32, for outputting the matching signal, is subjected to the electric signal released by the switching elements 23 and 24. In the present embodiment, the electric signal is an electric current powering the LED 32.

The inspection apparatus 1 depicted here comprises an energy storage 33 for electrically supplying the signaling element 31. This energy storage is made of a capacitor 34 with a voltage delimiting diode 35, like for example a Zener-diode 36, connected in parallel. The capacitor 34 is charged by the voltages present at the electric contacts 2, 3 with regard to the reference potential 19. The capacitor 34 is not discharged via the electric contacts 2, 3 even if no voltages with positive polarity with regard to ground potential 19 are present here. This is achieved by a diode 37, 39 assigned to each of the electric contacts 2 and 3, which, in its conductive direction, allows for charging the capacitor 34 but which blocks a discharge of the capacitor via the electric contacts 2, 3. By means of a further diode 38, 40 per contact 2, 3 it is achieved that the electric potentials of the contacts 2, 3 are brought close to the reference potential, if voltages of generally negative polarity with regard to the reference potential 19 are present here. As a result, the control terminals 27, 28 of the switching elements 23, 24 are at the same electric potential as their reference terminals 29, 30 as long as the switching elements 23, 24 block the electric signal.

To limit the current flowing from the capacitor 34 of the energy storage 33 through the signaling element 31, when a voltage of positive polarity is present at the electric contacts 2, 3, a current limiter 41 is provided in the embodiment of the inspection apparatus 1 depicted in FIG. 1. The current limiter 41, for example, inhibits a flicker of the LED 32 and ensures a uniform glow of the LED. The current limiter 41 is made of a transistor 42 and a resistor 43 here. Additionally, the inspection apparatus 1 depicted in FIG. 1 comprises a switch 44 which has to be closed for starting the operation of the inspection apparatus 1. The switch 44 is interconnected between the energy storage 33 and the current limiter 41 here. As long as the switch 44 is not yet closed, i.e. as long as the inspection apparatus 1 is not in operation, the current circuit is interrupted via which the electrical signal may be guided to the signaling element 31. Despite the fact that the switch 44 is indicated as being open in FIG. 1, it has been assumed that the switch 44 is closed in the explanations of the operation of the inspection apparatus 1 given above.

Figure 2:
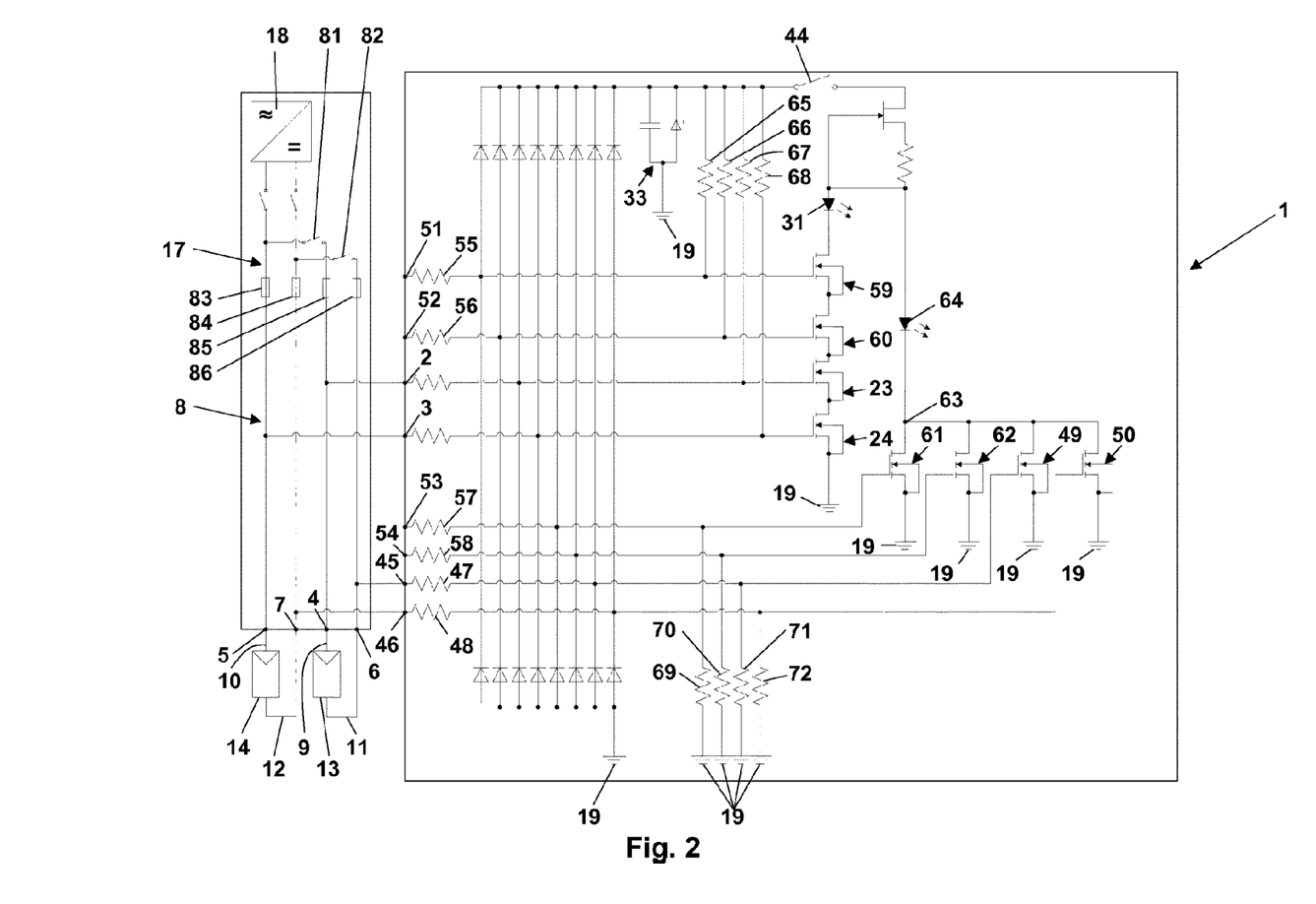
FIG. 2 is a schematic circuit diagram of a second embodiment of the inspection apparatus according to the disclosure which—besides a signaling element for a matching signal—comprises a further signaling element for an error signal.

FIG. 2 shows an embodiment of an inspection apparatus 1 according to the disclosure, which—besides the two electric contacts 2, 3—comprises further electric contacts 45, 46. The further electric contacts 45, 46 are to be connected or assigned to input terminals 6, 7 of the combiner circuit 8 to which the respective other poles 11, 12 of the DC voltage sources 13, 14 are connected. The combiner circuit 8 and the combining circuitry 17 are part of the inverter 18 here. The combining circuitry 17 has combining switches 81 and 82, which connect together the poles 9 and 10, and 11 and 12 of the same polarity. During operation of the inspection apparatus, however, these combining switches 81 and 82 are open. A further input resistor 47, 48 and a further switching element 49, 50 are assigned to each of the two further electric contacts 45, 46. Besides the electric contacts 2, 3 and the further electric contacts 45, 46 the inspection apparatus 1 depicted in FIG. 2 comprises additional electric contacts 51, 52 and additional further electric contacts 53, 54. These electric contacts 51 to 54 are provided for possible further input terminals of the combiner circuit 8, to which poles of further DC voltage sources may be connected for inspection. To the electric contacts 51, 52 and the further electric contacts 53, 54 additional input resistors 55 to 58 and switching elements 59 to 62 are assigned. The switching elements 23, 24, 59, 60 of all the electric contacts 2, 3, 51, 52 are electrically connected in series, whereas the further switching elements 49, 50, 61, 62 of all the further electric contacts 45, 46, 53, 54 are electrically connected in parallel.

The parallel connected further switching elements 49, 50, 61, 62 are connected to a further signaling element 64 via their common output 63. As soon as anyone of the further switching elements 49, 50, 61, 62 is in a closed or conductive switching state, the further signaling element 64 is subjected to an electric signal direction for outputting an error signal. This closed or conductive switching state in which the further electric signal for outputting the error signal is forwarded to the further signaling element 64 is taken up by the further switching elements 49, 50, 61, 62, if a voltage of a wrong polarity is present at the respective end of the further electric contacts 45, 46, 53, 54. The further electric signal, however, is blocked by the further switching elements 49, 50, 61, 62, if all the polarities of the voltages at the further electric contacts 45, 46, 53, 54 are matching the polarities pre-set for the respective input terminals of the combiner circuit.

The further signaling element 64, like the signaling element 31, is supplied with electric energy by the energy storage 33. The energy storage is made in a similar way as in FIG. 1, two diodes being assigned to each one of all electric contacts 2, 3, 51, 52 and 45, 46, 53, 54. One of these two diodes is always oriented in conductive direction. The other diode brings the potential present at one of the control terminals of the switching elements 23, 24, 49, 50, 59-62 close to the reference potential 19, if the polarity of the voltage of the respective electric contact 2, 3, 51, 52 or the respective further electric contact 45, 46, 53, 54 is generally negative.

A further ohmic resistor 65 to 72 is assigned to each of the electric contacts 2, 3, 51, 52 and the further electric contacts 45, 46, 53, 54 of the inspection apparatus 1. Via these resistors 65 to 72, a defined switching state of the switching elements 23, 24, 49, 50, 59 to 62 is adjusted, if no external voltage is present at the associated electric contacts 2, 3, 51, 52 and the further electric contacts 45, 46, 53, 54, e.g. in case these contacts are not connected to input terminals to which a pole of any DC voltage source is connected. In the embodiment depicted in FIG. 2, a voltage of the respective correct polarity is applied to the electric contacts 51, 52 and the further electric contacts 53, 54 which are not connected to input terminals of the combiner circuit 8. This means that a voltage of positive polarity with regard to the reference potential 19 is present at the control terminals of the switching elements 59 and 60 so that the two switching elements 59 and 60 forward the electric signal for outputting the matching signal to the signaling element 31. On the other hand, a potential close to the reference potential 19 is present at the control terminals of the further switching elements 61 and 62 so that the switching elements 61 and 62 block the further electric signal for outputting the error signal from the further signaling element 64. Thus, the function of the inspection apparatus 1 is not disturbed due to the fact that some of the electric contacts 2, 3, 51, 52 or the further electric contacts 45, 46, 53, 54 are not connected to any of the input terminals 4 to 7 of the combiner circuit 8.

It is an advantage of the inspection apparatus 1 depicted in FIG. 2 that it may directly be seen whether the inspection apparatus 1 is ready to operate and in good order. In this case, either the matching signal (case a) or the error signal (case b) is output, but at no time none of the signals is output. This is achieved in the following way:

Case a: If none of the voltages present at the further electric contacts 45, 46, 53, 54 has a positive polarity with regard to the reference potential 19, the further signaling element 64 is not subjected to the further electrical signal for outputting the error signal. In this case, however, the signaling element 31 is subjected to the electric signal for outputting the matching signal, as all polarities of all voltages present at the electric contacts 2, 3, 51, 52 are positive. Thus, all switching elements 23, 24, 59, 60 connected in series are forwarding the electrical signal to the signaling element 31 for outputting the matching signal. Consequently, only the matching signal is output in case a.

Case b: If a voltage of negative polarity is present at at least one of the electric contacts 2, 3, 51, 52, the associated switching element 23, 24, 59, 60 blocks. This results in that the signaling element 31 does not output the matching signal. In this case, however, a voltage of wrong polarity, i.e. positive polarity, is also present at at least one of the further electric contacts 45, 46, 53, 54. Correspondingly, the further electric signal is no longer blocked by all of the further switching elements 49, 50, 61, 62 but forwarded by at least one of them. Thus, the further signaling element 64 is subjected to the further electrical signal and outputs the error signal. Consequently, in case b only the error signal is output.

In that at least the signaling element 31 outputs the matching signal or the further signaling element 64 outputs the error signal, it can be acknowledged that the inspection apparatus 1 is ready to operate and in good order. None of the two signals being output indicates that the inspection apparatus 1 is not ready to operate. This includes the case in that no external voltage is present at any one of the contacts 2, 3, 51, 52 and 45, 46, 53, 54.

A further advantage of the embodiment depicted in FIG. 2 is that the poles 9 to 12 of the DC voltage sources 13, 14 may be inspected without these DC voltage sources having to be grounded. This is particularly achieved by the rectification via diodes and the further electric contacts 45, 46, which are connected to the input terminals 6, 7 for the negative poles 11, 12.

Figure 3:
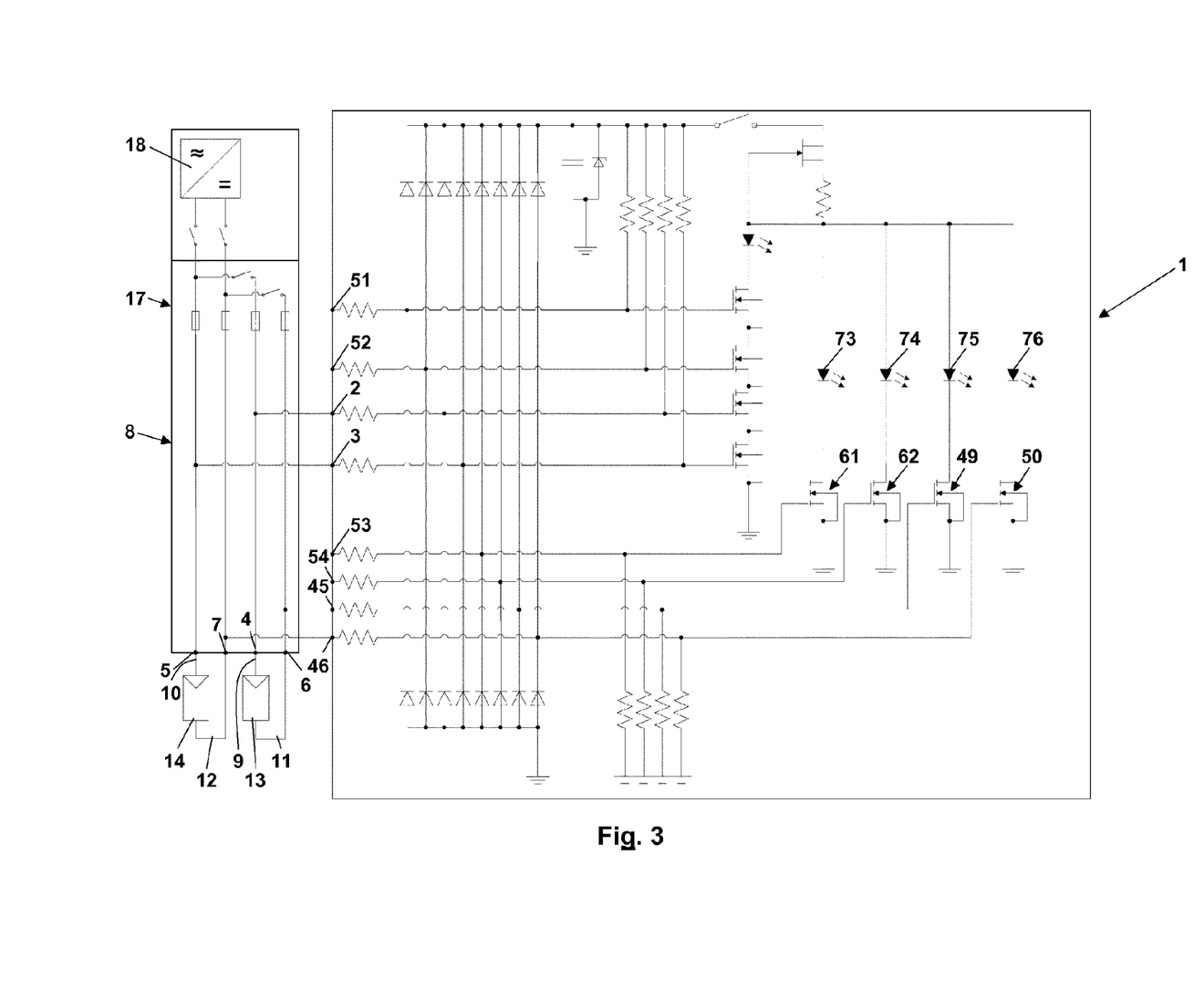
FIG. 3 is a schematic circuit diagram of a further embodiment of the inspection apparatus according to the disclosure which—besides the signaling element for the matching signal—comprises a plurality of further signaling elements for error signals.

FIG. 3 shows a further embodiment of the inspection apparatus 1 according to the disclosure which is similar to the one depicted in FIG. 2. In the embodiment depicted in FIG. 3, however, one further signaling element 73 to 76 is assigned to each of the further switching elements 49, 50, 61, 62. Thus, for each of the further electrical contacts 45, 46, 53, 54 it is separately indicated, whether a voltage of a wrong polarity is present at the respective further electric contact. In this embodiment of the inspection apparatus 1 according to the disclosure, it may be directly read out to which of the input terminals 4 to 7 any the poles 9 to 12 of the DC voltage source 13 to 14 are connected with wrong polarities. Further, the combiner circuit 8 is only combined with the combing circuitry 17 into one unit here but not with the inverter 18. Thus, the inverter may also be arranged remote from one or several such combiner circuits 8.

Figure 4:
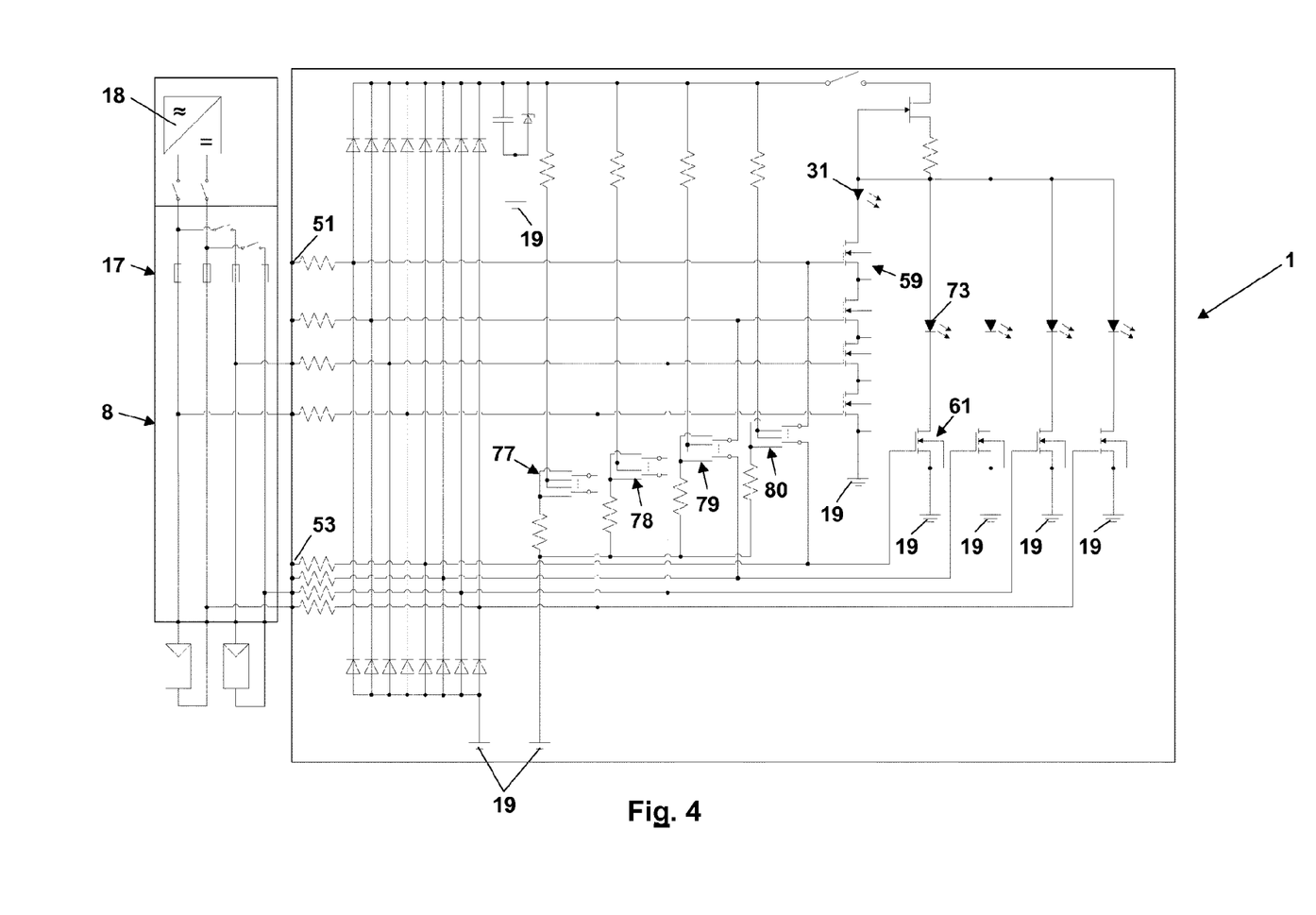
FIG. 4 is a schematic circuit diagram of a variant of the inspection apparatus according to the disclosure of FIG. 3, which is additionally equipped with changeover switches.

FIG. 4 shows an inspection apparatus 1 similar to the embodiment depicted in FIG. 3. In FIG. 4, however, one changeover switch 77 to 80 is assigned to each pair of one electric contact 2, 3, 51, 52 and the associated further electric contact 45, 46, 53, 54. For example, the changeover switch 80 is assigned to the electric contact 51 and the further electric contact 53. As long as no external voltage is present and depending on the switching state of the changeover switch 80, an electric potential close to the reference potential 19 may be applied via the changeover switch 80 to the electric contact 51. This electric potential results in that the associated switching element 59 blocks the electric signal for outputting the matching signal from the signaling element 31. Simultaneously, a voltage of positive polarity will be applied via the changeover switch 80 to the further electric contact 53 as long as no external voltage is present. The positive polarity of the voltage applied does not match to the polarity pre-set for the further electric contact 53. Thus, the associated further switching element 61 forwards the further electric signal for outputting the error signal, and the signaling element 73 is subjected to the further electric signal.

The changeover switch 80 is brought into this switching state, if external voltages have to be present at the contacts 51 and 53, because these contacts are assigned to input terminals of the combiners circuit which should be occupied and inspected. Then, the electric contact 51 and the further electric contact 53 have to be connected to input terminals to which the poles of the respective DC voltage source are connected with the pre-set polarity so that the switching state of the switching element 59 changes in such a way that it forwards the electric signal for outputting the matching signal towards the signaling element 31. At the same time, the switching state of the further switching element 61 is changed by a voltage of the correct polarity such that the further electric signal for outputting the error signal is blocked from the associated further signaling element 73. In this embodiment of the inspection apparatus 1 it is ensured that the inspection apparatus 1 does not output the matching signal but an error signal until at all electric contacts 2, 3, 51, 52 and 45, 46, 53, 54, which should be connected to input terminals 4 to 7 with a connected DC voltage source, a voltage of the respective correct polarity is actually present. In the embodiment depicted in FIG. 4, there are, however, no input terminals for the contacts 51 and 53 via which an external voltage is applied to these contacts 51, 53. Correspondingly, the changeover switch 80 is in a switching state in which a voltage of positive polarity is present at the electric contact 51, and a voltage close to the reference potential 19 is present at the further electric contact 53 so that the switching element 59 is closed and the further switching element 61 is open. Thus, the switching elements 59 and 61 do not inhibit the emission of the matching signal and the blocking of the error signal as long as voltages of the correct polarity are present at the electric contacts 2, 3, 52 and 45, 46, 54.

Many variations and modifications may be made to the preferred embodiments of the disclosure without departing substantially from the spirit and principles of the disclosure. All such modifications and variations are intended to be included herein within the scope of the present disclosure, as defined by the following claims.

The invention claimed is:

1. An inspection apparatus for inspecting polarities of poles of a plurality of DC voltage sources with regard to a reference potential, each pole being individually connected to one input terminal of a plurality of input terminals of a combiner circuit, the input terminals not being connected to each other, the inspection apparatus comprising:
at least two electric contacts each configured to be individually connected to one input terminal of the plurality of input terminals of the combiner circuit such that each one of the at least two electric contacts is connected to one pole of one of at least two DC voltage sources of the plurality of DC voltage sources, respectively,
a signaling element configured to emit a matching signal when subjected to an electrical signal, and
one switching element per each of the at least two electric contacts, the switching elements being configured to forward the electric signal towards the signaling element if a polarity of a voltage present at the respective electric contact matches a polarity pre-set for the respective electric contact with regard to the reference potential, and further configured to block the electric signal if the polarity of the voltage present at the respective electric contact does not match the pre-set polarity,
wherein the switching elements are electrically connected in series.

2. The inspection apparatus of claim 1, further comprising at least two further electric contacts each configured to be individually connected to one input terminal of the plurality of input terminals of the combiner circuit such that each one of the at least two further electric contacts is connected to another pole of one of the at least two DC voltage sources, respectively.

3. The inspection apparatus of claim 2, wherein the reference potential is defined by one of:
electric ground,
an externally defined absolute electric potential;
an average value of all electric potentials present at the electric contacts;
an average value of all electric potentials present at the further electric contacts;
an average value of all electric potentials of negative and positive polarity present at the electric contacts and the further electric contacts;
a highest electric potential of all electric potentials present at the electric contacts and the further electric contacts; and
a lowest electric potential of all electric potentials present at the electric contacts and the further electric contacts.

4. The inspection apparatus of claim 2, further comprising at least one further signaling element configured to emit an error signal if a polarity of a voltage present at one further electric contact of the at least two further electric contacts does not match a polarity pre-set for the respective further electric contact with regard to the reference potential.

5. The inspection apparatus of claim 4, further comprising one further signaling element configured to emit an error signal per each further electric contact of the at least two further electric contacts.

6. The inspection apparatus of claim 4, wherein each further electric contact of the at least two further electric contacts is connected to a further switching element, wherein each further switching element is configured to forward a further electric signal towards the respective further signaling element if the polarity of the voltage present at the respective further electric contact of the at least two further electric contacts does not match the pre-set polarity, and is configured to block the electric signal if the polarity of the voltage matches the pre-set polarity.

7. The inspection apparatus of claim 6, wherein all switching elements and all further switching elements are semiconductor switching elements.

8. The inspection apparatus of claim 7, wherein the semiconductor switching elements are normally off semiconductor switching elements.

9. The inspection apparatus of claim 7, wherein each semiconductor switching element comprises a reference terminal at which the reference potential is present, and a control terminal at which a voltage having the same polarity as the voltage present at the respective electric contact or at the respective further electric contact is present.

10. The inspection apparatus of claim 9, wherein each semiconductor switching element is configured to be off if the reference potential is also present at its control terminal.

11. The inspection apparatus of claim 9, further comprising two diodes of equal conductive direction per each semiconductor switching element, wherein one diode of the two diodes is electrically interconnected between a reference terminal end of the switching elements connected in series and the control terminal of its respective semiconductor switching element, and the other diode of the two diodes is electrically interconnected between the control terminal of its respective semiconductor switching element and an opposite common output end of the switching elements connected in series.

12. The inspection apparatus of claim 6, wherein switching states of the switching elements are adjustable, in which the switching elements and the further switching elements are without an external voltage being present at the electric contacts and the further electric contacts, and in which the switching elements block the electric signal and the further switching elements forward the further electric signal.

13. The inspection apparatus of claim 6, wherein each signaling element includes a light emitting diode (LED).

14. The inspection apparatus of claim 6, further comprising an energy storage configured to supply the respective further signaling element subjected to the further electric signal with electric energy for outputting the error signal.

15. The inspection apparatus of claim 14, wherein the energy storage comprises a capacitor chargeable based on the voltages present at the electric contacts and the further electric contacts, and a voltage limiting diode electrically connected in parallel to the capacitor.

16. The inspection apparatus of claim 2, wherein an internal voltage is present at each electric contact and each further electric contact at which no external voltage is present because no pole of the plurality of DC voltage sources is connected to the respective input terminal, and wherein a polarity of the internal voltage with regard to the reference potential matches the polarity pre-set for the respective electric contact or further electric contact.

17. The inspection apparatus of claim 2, wherein an internal voltage is present at each electric contact and each further electric contact at which no external voltage is present although one pole of the plurality of DC voltage sources is to be connected to the associated input terminal, and wherein a polarity of the internal voltage with regard to the reference potential does not match the polarity pre-set for the respective electric contact or further electric contact.

18. The signaling element of claim 2, further comprising an energy storage configured to supply the signaling element subjected to the electric signal with electric energy for outputting the matching signal.

19. The inspection apparatus of claim 18, wherein the energy storage comprises a capacitor chargeable based on the voltages present at the electric contacts and the further electric contacts, and a voltage limiting diode electrically connected in parallel to the capacitor.

20. The inspection apparatus of claim 1, wherein the signaling element includes a light emitting diode (LED).

21. The inspection apparatus of claim 1 made as a handheld device comprising a housing and a connector block via which the input terminals of the combiner circuit are connectable to the electric contacts and the further electric contacts in a predefined one-to-one relationship.

* * * * *